(12) United States Patent
Rodi

(10) Patent No.: US 6,525,675 B2
(45) Date of Patent: Feb. 25, 2003

(54) POSITION ENCODER FOR DETERMINING THE ANGLE OR POSITION AND THE TOTAL ANGLE ON DISTANCE MOVED

(76) Inventor: Anton Rodi, Paul-Ehrlich-Strasse 1, D-69181 Leimen (DE)

(*) Notice: Subject to any disclaimer, the term of this patent is extended or adjusted under 35 U.S.C. 154(b) by 0 days.

(21) Appl. No.: 10/116,539

(22) Filed: Apr. 4, 2002

(65) Prior Publication Data

US 2002/0145544 A1 Oct. 10, 2002

(30) Foreign Application Priority Data

Apr. 5, 2001 (DE) .......................... 101 17 194

(51) Int. Cl.[7] .............................................. H03M 1/22
(52) U.S. Cl. .......................... 341/13; 341/6; 341/106; 341/166; 341/2
(58) Field of Search .............................. 341/13, 12, 11; 250/237; 318/604

(56) References Cited

U.S. PATENT DOCUMENTS

| | | | | |
|---|---|---|---|---|
| 4,031,445 A | * | 6/1977 | Schmermund | 318/568.1 |
| 4,328,463 A | * | 5/1982 | Avins | 341/13 |
| 4,361,831 A | * | 11/1982 | Grutzediek et al. | 341/168 |
| 4,384,275 A | * | 5/1983 | Masel et al. | 341/2 |
| 4,536,744 A | * | 8/1985 | Brown | 341/166 |
| 4,599,600 A | * | 7/1986 | McGuire et al. | 341/6 |
| 4,847,619 A | * | 7/1989 | Kato et al. | 341/106 |
| 5,923,038 A | * | 7/1999 | DiFilippo et al. | 250/363.04 |
| 6,188,518 B1 | * | 2/2001 | Martin | 348/51 |
| 6,300,884 B1 | * | 10/2001 | Wilson | 341/6 |

FOREIGN PATENT DOCUMENTS

| | | |
|---|---|---|
| DE | 37 44 200 A1 | 7/1989 |
| DE | 38 15 534 A1 | 11/1989 |
| DE | 38 29 405 A1 | 3/1990 |
| DE | 40 11 411 C2 | 10/1991 |
| DE | 42 32 950 A1 | 4/1994 |
| DE | 43 42 377 A1 | 6/1995 |
| DE | 197 11 218 C1 | 4/1998 |
| DE | 197 02 931 C1 | 7/1998 |
| EP | 0 400 790 B1 | 7/1993 |
| EP | 0 603 506 A2 | 6/1994 |

* cited by examiner

*Primary Examiner*—Michael Tokar
*Assistant Examiner*—Lam T. Mai
(74) *Attorney, Agent, or Firm*—Laurence A. Greenberg; Werner H. Stemer; Gregory L. Mayback

(57) ABSTRACT

An angular position/position encoder is provided for determining the position of a moving part through evaluation of the direction-specific changes in the measured values recorded and for serial output in binary form of the position determined in this way, wherein all changes in measured values are also added together, independent of the direction of movement, and then output as the result of the total distance or angle traveled.

10 Claims, 1 Drawing Sheet

POSITION ENCODER FOR DETERMINING THE ANGLE OR POSITION AND THE TOTAL ANGLE ON DISTANCE MOVED

BACKGROUND OF THE INVENTION

Field of the Invention

The invention relates to an angular position or position encoder.

Previous angular position/position measuring systems always record relative positions or positions that change absolutely, and then forward these to a control system for evaluation. This is also sufficient for positioning and control tasks.

However, recording the total distance traveled by an adjustment device has previously always involved the use of separate mechanical/electromechanical counting devices or electronic counters with a battery buffer. This type of system is well known from its use in cars as a mileage indicator or on printing presses as a totalizer. On printing presses, for example, these totalizers are used to give a reliable readout of the number of sheets printed, reliability which is crucial for calculating and measuring the print run length and utilization of the press. The German Patent Specification No. DE 37 44 200 (which corresponds to U.S. Pat. No. 5,040, 180) purports to disclose a method where this type of data is saved securely in an interconnected system of several redundant electronic boards, each of which having non-volatile memory. This is possible for this type of complex machine control system and demands system control of hardware and software. Irrespective of the time and costs involved, this is not easy to handle and there are currently no solutions on the market that are suitable for broad use in universal applications.

SUMMARY OF THE INVENTION

It is accordingly an object of the invention to provide an angular position/position encoder which overcomes the above-mentioned disadvantages of the heretofore-known encoders of this general type and which is easy-to-use, precise, reliable yet inexpensive and which can display the position and the total distance traveled (angular position).

With the foregoing and other objects in view there is provided, in accordance with the invention, an angular position/position encoder for determining the position of a moving part through evaluation of the direction-specific changes (in 2) in the measured values recorded and for serial output in binary form (via 3) of the position determined in this way, wherein all changes in measured values are also added together (in 4), independent of the direction of movement, with the sum total being made available (at 6).

According to another feature of the invention, the measuring range refers to a closed angle of 360°.

According to another feature of the invention, the measuring range refers to a partial angle/distance, whereby the finite total angle/distance is made up of more than one of the partial angles/distances that can be recorded.

According to another feature of the invention, the sums determined in this way are saved to non-volatile memory (in 4).

The idea behind the invention is to take advantage of the fact that with the use of a new absolute encoder to measure positions or angular positions in accordance with the Swiss Patent Application No. 2105/99, all the signal processing takes place in the encoder itself, and that data outputs can be made for almost any length of information. This is not insignificant, since if we take the example of a machine tool which, in two-shift operation, may be in use for up to approximately 3000 hours per year at an average speed of approximately 1000 rpm which means that the total number of revolutions made in 10 years is $U=10*(3*10^3)*(1*10^3)*60=2*10^9$, or $U=2^{31}$ revolutions. This would require a 31-digit binary output.

Modern servo drives move in various directions with extremely fast acceleration, in some cases also just around a specific position value with many small partial sections, meaning that recording the angular position or distance traveled would involve a complex encoder signal transmission and require a powerful external control system.

In accordance with the present invention, the changing position values are continuously added to measured values smaller than or equal to a measuring range (in the simplest case a 360° revolution) in an angular position/position encoder and are, if required, made available for output in the form of angular or position units which correspond to the measuring range. The angular positions and positions that are determined in this way should then be saved to non-volatile memory to safeguard against mains power cuts, so that when the device is switched on again, the last total sum of the measured value of the angular position/position is available for output via a serial interface with sufficient binary digits. The SSI interface is ideal here, since it can provide the data quickly enough and is already an industrial standard for absolute-measuring encoder systems.

If the distances traveled are also to be recorded when the mains power is switched off, for example battery-powered angular position/position measurements are required. However, these requests are less significant for industrial use than the mode of positioning within, for example, 360°, which is becoming increasingly important, and also less significant than the short distances which must be recorded with corresponding precision and then added. This means that the angular position/distance actually traveled is determined and can be used for many machine-maintenance purposes, for example lubrication cycles, utilization rate and also for guaranteed values. This type of measuring system to record angular position/distance traveled is particularly efficient when implemented as a component in an absolute angle/position measuring system. Although the inventive method includes the shortest distance to be recorded by the measuring system, it can still be expedient not to use the last bit of resolution of an absolute encoder for this. If a measuring system is just positioned at a defined point of the resolution limit, values which do not correspond to the distance traveled are added together, since the last counted distance, for example that of a binary value, often changes by just 1 bit without covering the adequate distance. In practice, for example, angles/distances of a small 10-bit resolution of a measuring range (which corresponds to an angle of $\frac{1}{3}°$ in a measuring range of 360°) are of no significance in proportion to the total distance traveled.

The most diverse of angular position and position measuring systems are available, and these are used to measure the most varying distances. There are, for example, rotary encoders in multiturn design, which give the position within a closed 360° rotation and the number of rotations traveled from the home position with direction-specific evaluation (multiple 360°). Angular position and position measuring systems with a measuring range of less than one full revolution, (i.e. less than 360°) are also known, as are incremental linear measuring systems and, increasingly, absolute measuring systems which refer to the finite distance traveled.

If several such angular position/position encoders are in use in a single unit, device or, for example, robot, plausibility checks of the angles/distances traveled can be carried out. In such cases, redundancy also enables measurements of the angular positions/positions to be made very reliably in the event of encoder failure.

The fundamental idea behind the invention can be used for all encoder designs and, in particular, for the new absolute angular position/position measuring systems, which meet multiple prerequisites for signal processing of the position values and data transfer of the measured distances traveled.

Other features which are considered as characteristic for the invention are set forth in the appended claims.

Although the invention is illustrated and described herein as embodied in an angular position/position encoder it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
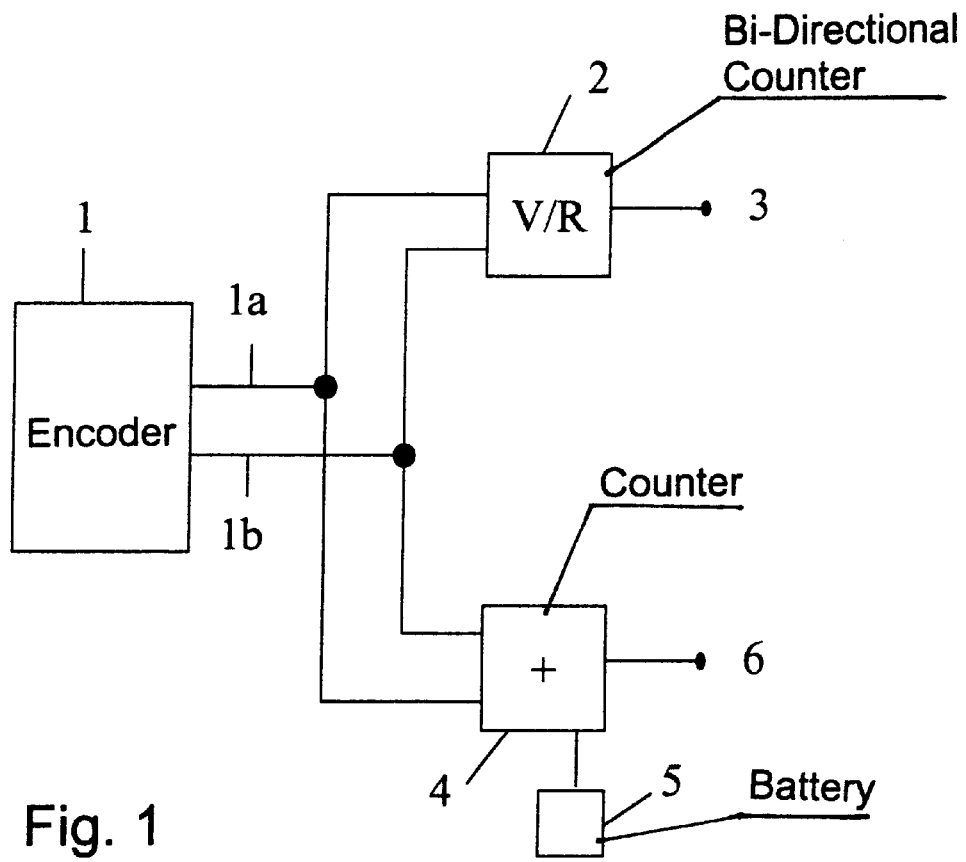
FIG. 1 is a block diagram of an encoder configuration according to the invention.
Figure 2:
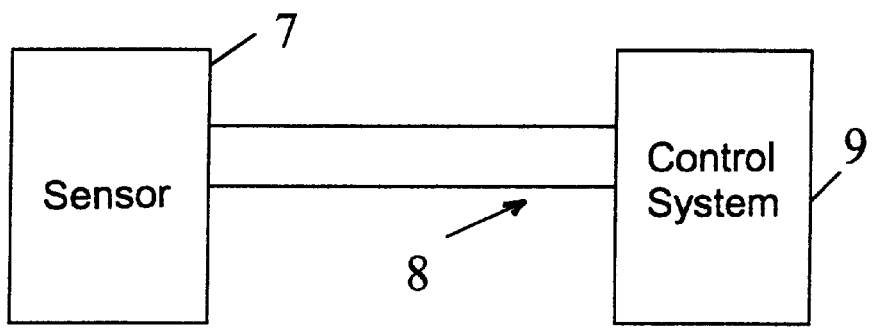
FIG. 2 is a block diagram illustrating a sensor connected to a control system.

Referring now to the figures of the drawings in detail and first, particularly, to FIG. 1 thereof, there is shown an embodiment of the invention to illustrate the essential features of the invention, where 1 represents an encoder that outputs pulses in the event of movement, which are totalized in a bi-directional counter 2, taking into account the direction of movement. The position of the encoder within the range to be monitored is determined from this. This information on the position is sent out via a serial output 3 of the encoder arrangement, where it is processed further. The pulses output as a function of the direction of movement via lines 1a and 1b are also delivered to a counter 4, which adds together all the pulses regardless of their direction of movement, and thereby supplies a result that corresponds to the total angle or distance traveled. This result is saved when the unit is switched off, which is why a capacitor or a battery 5 is provided. The accumulated result can be called up via a serial output 6.

The output of the angle/distance traveled by sensor 7 via a serial interface 8, which is used to output the respective absolute values measured, is not detailed further. A control system 9 can transmit specific parameters or commands, while corresponding data, for example, in this case the position and/or the distance/angular distance traveled, can be called up via the same serial interface.

I claim:

1. An angular position/position encoder for determining the position of a moving part through evaluation of the direction-specific changes (in 2) in the measured values recorded and for serial output in binary form (via 3; 8) of the position determined in this way, wherein all changes in measured values are also added together (in 4), independent of the direction of movement, with the sum total being made available (at 6; 8).

2. The angular position/position encoder according to claim 1, wherein the measuring range refers to a closed angle of 360°.

3. The angular position/position encoder according to claim 1, wherein the measuring range refers to a partial angle/distance, whereby the finite total angle/distance is made up of more than one of the partial angles/distances that can be recorded.

4. The angular position/position encoder according to claim 1, wherein the sums determined in this way are saved to non-volatile memory (in 4).

5. A position encoder for determining an angle or position and a total angle or distance moved by a moving part, comprising:

an encoder outputting a pulse when there is a movement of the moving part;

a directional counter counting the pulses output by said encoder taking into account a direction of movement of the moving part, thereby determining an angle or position of the moving part; and a non-directional counter counting the pulse output by said encoder irrespective of the direction of movement of the moving part, thereby determining a total angle or distance moved by the moving part.

6. The position encoder according to claim 5, wherein the moving part moves within a measuring range.

7. The position encoder according to claim 6, wherein the measuring range refers to a closed angle of 360°.

8. The position encoder according to claim 6, wherein the measuring range refers to a partial angle/distance, whereby the finite total angle/distance is made up of more than one of the partial angles/distances that can be recorded.

9. The position encoder according to claim 6, wherein said non-directional counter has a non-volatile memory for storing the total angle or distance moved by the moving part.

10. The position encoder according to claim 5, wherein said encoder performs all the signal processing such that a data output can be made for almost any length of information.

* * * * *